(12) United States Patent
Yang

(10) Patent No.: US 6,600,376 B1
(45) Date of Patent: Jul. 29, 2003

(54) HIGH EFFICIENCY POWER AMPLIFIER

(75) Inventor: Lee-Lung Yang, Chu-Pei (TW)

(73) Assignee: Entrust Power Co., Ltd., Su Lin (TW)

( * ) Notice: Subject to any disclaimer, the term of this patent is extended or adjusted under 35 U.S.C. 154(b) by 0 days.

(21) Appl. No.: 10/226,354

(22) Filed: Aug. 23, 2002

(51) Int. Cl.[7] .............................................. H03F 3/04
(52) U.S. Cl. .................... 330/297; 330/10; 330/127; 363/41
(58) Field of Search .......................... 330/10, 127, 136, 330/297, 129; 363/41

(56) References Cited

U.S. PATENT DOCUMENTS

| | | | | |
|---|---|---|---|---|
| 4,685,042 A | * | 8/1987 | Severinsky | 363/41 |
| 5,745,526 A | * | 4/1998 | Kumm et al. | 375/297 |
| 5,990,751 A | * | 11/1999 | Takita | 330/297 |

* cited by examiner

Primary Examiner—Henry Choe
(74) Attorney, Agent, or Firm—Dickinson Wright PLLC

(57) ABSTRACT

The high efficiency amplifier system of the present invention dynamically changes the level of the supply voltage in response to changes of the input analog signal. The voltage supplied to the amplifier circuit is minimized to avoid the consumption of power.

29 Claims, 8 Drawing Sheets

HIGH EFFICIENCY POWER AMPLIFIER

BACKGROUND OF THE INVENTION

1. Field of Invention

The present invention relates to a power amplifier, and more particularly to a high efficiency power amplifier.

2. Description of Related Art

As is well known, an amplifier is a device that receives an input and applies a defined gain in order to produce an output that is greater than the input. For example, a voltage amplifier may receive a 10V input and produce an output of 20V, if the voltage amplifier has a gain of two. Amplifiers are able to apply the gain to produce an output up to a certain value. For example, a voltage amplifier can produce an output up to a value of the operational voltage applied to the amplifier. That is, a voltage amplifier with an operational voltage of 15V and a gain of three can produce the desired output as long as the input does not exceed 5V. If the voltage amplifier receives an input voltage of 6V it attempts to produce an output of 18V, which is above the maximum that this voltage amplifier can produce. Therefore, the voltage amplifier does not have the potential to drive the load to the desired voltage.

Amplifiers work best if they produce outputs near the maximum output of the amplifier. That is, an amplifier with an operational voltage of 15V works most efficiently when producing outputs around 15V. However, the typical outputs of a 15V amplifier are probably much lower since the 15V operating voltage (i.e., maximum output) is selected to handle peak input voltages. For example, the maximum input voltage (peak voltage) for a 15V amplifier with a gain of three is 5V, and a typical input voltage may be in the range of 1–3V.

FIG. 1 illustrates a schematic diagram of a conventional sine wave amplifier system. The power circuit 101 transfers the received AC power or DC power to a required operation voltage supplied to the amplifier circuit 102. The amplifier circuit 102 receives the sine wave signal supplied from the small signal producer 103 and produces an output according the defined gain of the amplifier circuit 102. FIG. 2 is a schematic diagram illustrating a conventional Class B amplifier circuit 102. Other amplifier circuits, such as Class A, Class AB or other types of amplifier circuits, may use the same method described in the following for analysis. First, this amplifier circuit 102 is powered by a pair of operation voltages (+V and -V) supplied from the power circuit 101. The transistor Q1 is responsible for amplifying the received signal during period T1, and the transistor Q2 is responsible for amplifying the received signal during period T2. Both Q1 and Q2 transistors operate in a linear region.

FIG. 3 is a waveform diagram further illustrating the operation of the conventional sine wave amplifier system. The amplifier circuit 102 receives a small signal supplied from the small signal producer 103 and produces a sine wave output according to the defined gain. The amplifier circuit 102 is powered by a pair of operation voltage sources (+V and -V) supplied from the power circuit 101. As the chart depicts, the typical maximum output voltage $V_p$ is required to be between +V and -V. The sine wave output signal $V_R$ is represented by the following equation:

$$V_R = V_P \times \sin(2\pi f t)$$

Therefore, the output efficiency varies with the output signal waveform. Typically, the amplifier circuit 102 runs at peak efficiency periodically when peak output voltage $V_p$ appears. Therefore, the sine wave amplifier system as shown in FIG. 1 is very inefficient. On the other hand, the voltage difference ($V_{ce}$) between the collector electrode and the emitter electrode of the transistors $Q_1$ and $Q_2$ is changed when the output signal changes. The power dissipation is as follows:

$$\text{powerdissipation} = V_{ce} \times I_c \tag{1}$$

$V_{ce}$ is the voltage difference between the collector electrode and the emitter electrode of the transistor. $I_c$ is the current of the collector electrode. The equations shown in the following describe the voltage $V_{ce}$ and the current $I_c$ of the transistors $Q_1$ and $Q_2$, respectively:

$$V_{ce}(Q_1) = V - V_p \times \sin(2\pi f t)$$
$$V_{ce}(Q_2) = V + V_p \times \sin(2\pi f t)$$

$$I_c(Q_1) = V_p \times \sin(2\pi f t)/R \quad \sin(2\pi f t) > 0$$
$$I_c(Q_1) = 0 \quad \sin(2\pi f t) < 0$$
$$I_c(Q_2) = V_p \times \sin(2\pi f t)/R \quad \sin(2\pi f t) < 0$$
$$I_c(Q_2) = 0 \quad \sin(2\pi f t) > 0$$

In accordance with equation (1), the power dissipation of the transistors is as follows:

$$\text{powerdissipation} = V_{ce}(Q_1) \times I_c(Q_1) + V_{ce}(Q_2) \times I_c(Q_2)$$

In accordance with the above equation, the power dissipation is about 30% to 70%.

Thus, an inherent problem associated with standard amplifiers is the conflict between the desirability of providing large output potentials and the undesirability of providing lower potentials through a large potential drop. One solution is provided in FIG. 4. FIG. 4 illustrates a schematic diagram of an amplifier system in accordance with the conventional analog to digital amplifier system. The power circuit 401 transfers the received AC power or DC power to the required operation voltage supplied to the analog to digital amplifier circuit 402. The analog to digital amplifier circuit 402 receives the sine wave signal supplied from the small signal producer 403 and produces a pulse-width-modulation (PWM) wave, in which the analog to digital amplifier circuit 402 is controlled by a PWM signal that is provided by the PWM signal producer 404. Then, the PWM wave passes through the semiconductor switch 405 and is provided to the wave filter, which comprises an inductor L and a capacitor C, to produce an output wave that is enlarged and in the same phase with the input sine wave signal. Although such an analog to digital amplifier system may obtain a high output efficiency, the wave filter requires a high-value inductor and thus occupies a large area and raises the power dissipation.

SUMMARY OF THE INVENTION

According to the above descriptions, because the conventional amplifier system needs to handle the peak outputs, the output efficiency cannot attain an optimal state. Even though the output efficiency may be raised by such an analog to digital amplifier system, this analog to digital amplifier system requires a wave filter that is composed of an inductor L and a capacitor C to produce an enlarged output wave in the same phase with the input sine wave signal. Although such an analog to digital amplifier system may obtain high output efficiency, the wave filter requires a high-value inductor and thus occupies a large area and raises the power dissipation. Therefore, this present invention provides a new amplifier system structure to overcome the above drawbacks, such as low output efficiency and large area occupation.

Typically, the efficiency of an amplifier circuit can be improved by dynamically changing the level of the supply voltages. That is, the level of the supply voltages is changed in response to changes in the level of the input analog signal. The goal of this strategy is to minimize the voltages supplied to the amplifier circuit to avoid extra power dissipation. In other words, the level of the supply voltages is changed in response to changes in the level of the input analog signal. Therefore, when a peak signal must be transmitted, the supply voltages supply at their respective high levels. When a lower level signal must be transmitted, the supply voltages supply at their respective lower levels. Dynamically changing the level of the supply voltages minimizes the power dissipation.

In accordance with the above description, the main purpose of the present invention is to provide an amplifier system that dynamically changes the level of the supply voltages.

Another purpose of the present invention is to provide an amplifier system for receiving an input analog signal and generating a corresponding output analog signal.

A further purpose of the present invention is to provide an amplifier system that dynamically changes the level of the supply voltages to enlarge any kind of signal with a minimum power dissipation.

Yet another purpose of the present invention is to provide an amplifier system that can handle a peak input voltage while maintaining high output efficiency at any time.

To accomplish this, an amplifier system of the present invention comprises a rectifier circuit, two switching circuits, a D.C.-to-A.C. circuit, a sine wave producer and logic control circuit, a pulse-width-modulation and phase signal producer circuit, a feedback circuit and a linear amplifier circuit. The rectifier circuit, two switching circuits and a D.C.-to-A.C. circuit comprise the power circuit of the amplifier system in accordance with the present invention.

The pulse-width-modulation and phase signal producer circuit generate a series of pulse-width-modulation (PWM) signals. These PWM signals are used to control the switching circuits and the D.C.-to-A.C. circuit, respectively, to transform the received AC or DC power into dynamic power supplied to the amplifier circuit. The amplifier circuit receives the input sine wave generated by the sine wave producer and logic control circuit and generates a corresponding output sine wave that is greater than the input. The feedback circuit connects the amplifier circuit and the pulse-width-modulation and phase signal producer circuit. The feedback circuit transmits the dynamic power supplied to the amplifier circuit to the pulse-width-modulation and phase signal producer circuit to modulate the PWM signal. The modulated PWM signal ensures that the dynamic power keeps the same phase as the input sine wave and follows the voltage curve of the input sine wave.

On the other hand, because the present invention may produce a dynamic power according to the input signal, the efficiency of the amplifier circuit can be significantly improved by dynamically changing the level of the supply voltages.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

Figure 1:
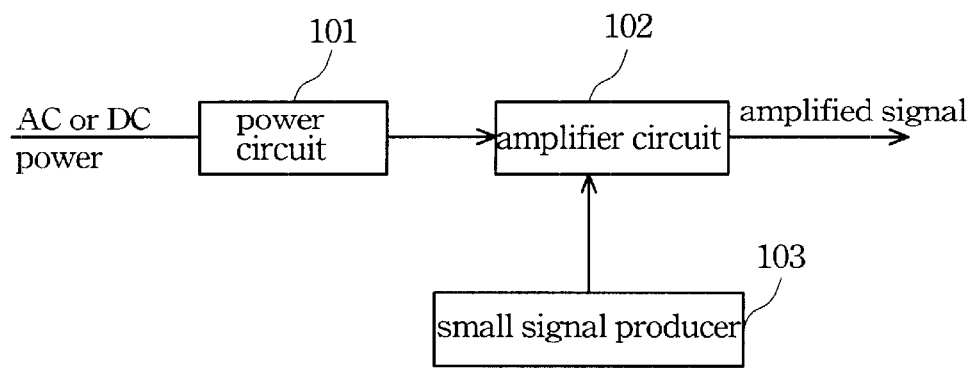
FIG. 1 is a schematic diagram of a conventional sine wave amplifier system.
Figure 2:
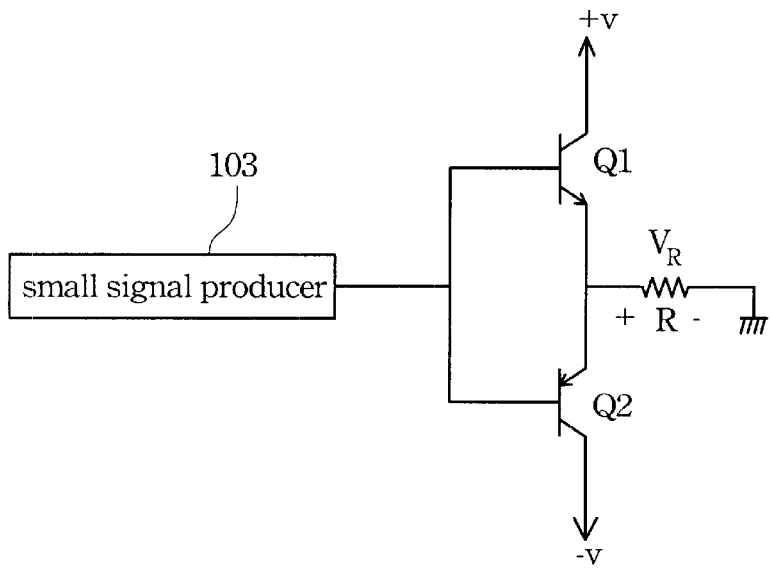
FIG. 2 is an enlarged schematic diagram of a conventional Class B amplifier circuit.
Figure 3:
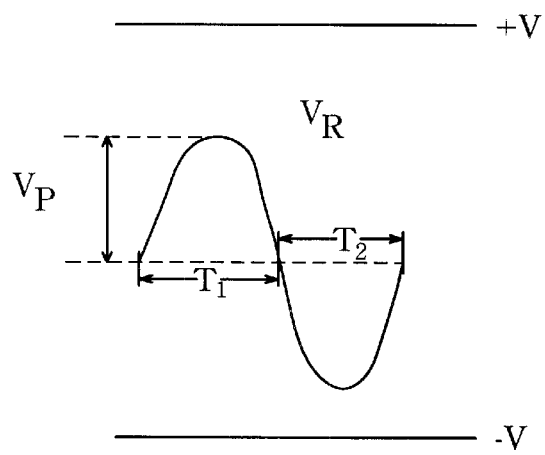
FIG. 3 is a waveform diagram further illustrating the operation of the conventional sine wave amplifier system.
Figure 4:
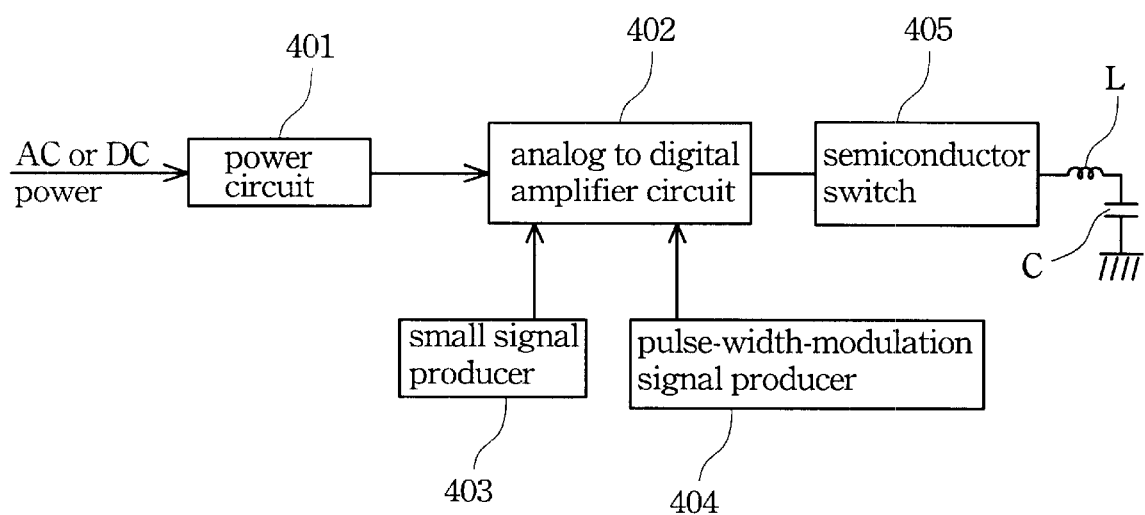
FIG. 4 is an enlarged schematic diagram of an amplifier system in accordance with the conventional analog to digital amplifier system.

Without limiting the spirit and scope of the present invention, the circuit structure of an amplifier system proposed in the present invention is illustrated with one preferred embodiment. Skilled artisans, upon acknowledging the embodiments, can apply the circuit structure of the present invention to any kind of amplifier system to avoid the extra power dissipation. Because the conventional amplifier system needs to handle the peak outputs, conventional output efficiency cannot reach an optimal state.

On the other hand, although the output efficiency is raised by using an analog to digital amplifier system, this analog to digital amplifier system requires a wave filter that comprises an inductor L and a capacitor C to generate a corresponding output analog wave in the same phase with the input analog signal. Although such an analog to digital amplifier system may eliminate the problem of low output efficiency, the wave filter requires a high-value inductor and thus occupies a large area and raises the power dissipation. The present invention also solves this problem. The application of the present invention is not limited by the following description.

Typically, the efficiency of the amplifier circuit can be improved by dynamically changing the levels of the supply voltages. That is, the levels of the supply voltages change in response to changes in the level of the input analog signal. The goal of this strategy is to minimize the voltages supplied to the amplifier circuit to avoid extra power dissipation. In other words, the levels of the supply voltages are changed in response to changes in the level of the input analog signal. Therefore, when a signal peak must be transmitted, the supply voltages supply at their respective high levels. When a lower level signal must be transmitted, the supply voltages supply at their respective lower levels. Therefore, the present invention utilizes such dynamic changes in the levels of the supply voltages to minimize the power dissipation. In describing a preferred embodiment of the invention illustrated in the drawings, specific terminology is used for the sake of clarity. However, the invention is not intended to be limited to the specific terms so selected, and it is to be understood that each specific term includes all technical equivalents that operate in a similar manner accomplish a similar purpose. On the other hand, the amplifier is illustrated as a voltage amplifier, but should not be construed as being limited to a voltage amplifier.

Figure 5:
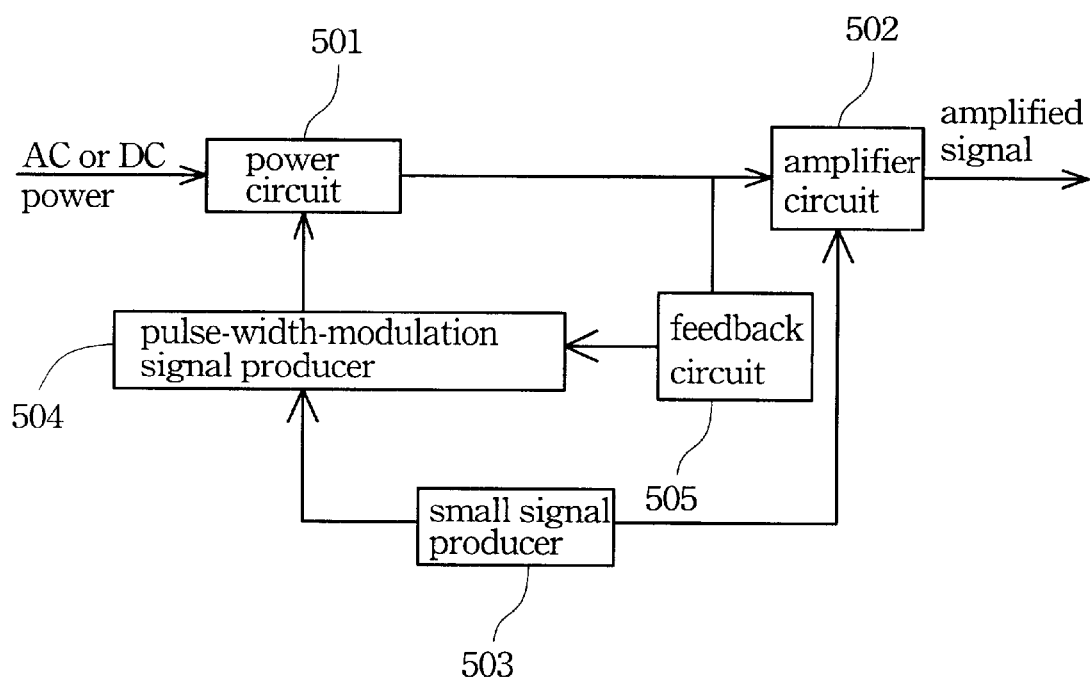
FIG. 5 is a schematic diagram of a high efficiency amplifier system in accordance with the present invention.

FIG. 5 is a schematic diagram of a high efficiency amplifier system in accordance with the present invention. The pulse-width-modulation signal producer 504 generates a pulse-width-modulation (PWM) signal. The PWM signal is used to control the power circuit 501 to transform the received AC or DC power into dynamic power supplied to the amplifier circuit 502. The amplifier circuit 502 receives the input sine wave generated by the small signal producer 503 and generates a corresponding output sine wave that is greater than the input sine wave. The amplifier circuit 502 is a conventional Class B driver circuit. Other amplifier circuits, such as a Class A, Class AB or other type of amplifier circuit, may also be used in the present invention. The main point of difference between the present invention's amplifier system and the conventional amplifier system, as shown in FIG. 1, is that the power circuit of the conventional amplifier system needs to transform the input AC or DC power into a positive supply voltage (+V) and a negative supply voltage (−V) provided to the amplifier circuit as the operation voltage. However, the power circuit 501 of the present invention is controlled by the PWM signal to generate a dynamic power that changes in response to the changes in the level of the input sine wave. The efficiency of the amplifier circuit is thus improved.

In accordance with the preferred embodiment, the sine wave generated by the small signal producer 503 transmits not only to the amplifier circuit 502 but also to the pulse-width-modulation signal producer 504 for generating a square signal having the same phase as the input sine wave and a PWM signal ($PWM_2$). Then, the square signal and the PWM signal ($PWM_2$) are sent to the power circuit 501 as the control signals. The power circuit 501 first transforms the AC power into the DC operation voltage. Then, another PWM signal ($PWM_1$) is used to modulate the DC operation voltage to form a series of pulses with a high and modulated frequency, in which the modulated frequency and the width of the pulses can be controlled by the feedback circuit 505. The high-frequency pulses are sent to a transformer and a D.C.-to-A.C. circuit to form a dynamic power supplied to the amplifier circuit 502.

In addition, a feedback circuit 505 connects the amplifier circuit 502 and the pulse-width-modulation signal producer 504 to ensure that the dynamic power changes with the sine wave generated by the small signal producer 503. The feedback circuit receives the dynamic power to produce a feedback voltage signal for the pulse-width-modulation signal producer 504. Then, the feedback voltage signal is compared with the sine wave generated by the small signal producer 503 to produce a PWM signal ($PWM_2$) for tuning the dynamic power. That is, if the feedback voltage is lower than the voltage of the sine wave, a PWM signal ($PWM_2$) is produced to modulate the dynamic power. The undulation of the feedback voltage value responds to the undulation of the sine wave. In other words, the undulation of the dynamic power provided to the amplifier circuit 502 also responds to the undulation of the sine wave. Similarly, if the feedback voltage signal is greater than the voltage of the sine wave, no PWM signal ($PWM_2$) is produced. This leads the potential of the dynamic power to decrease.

Figure 6:
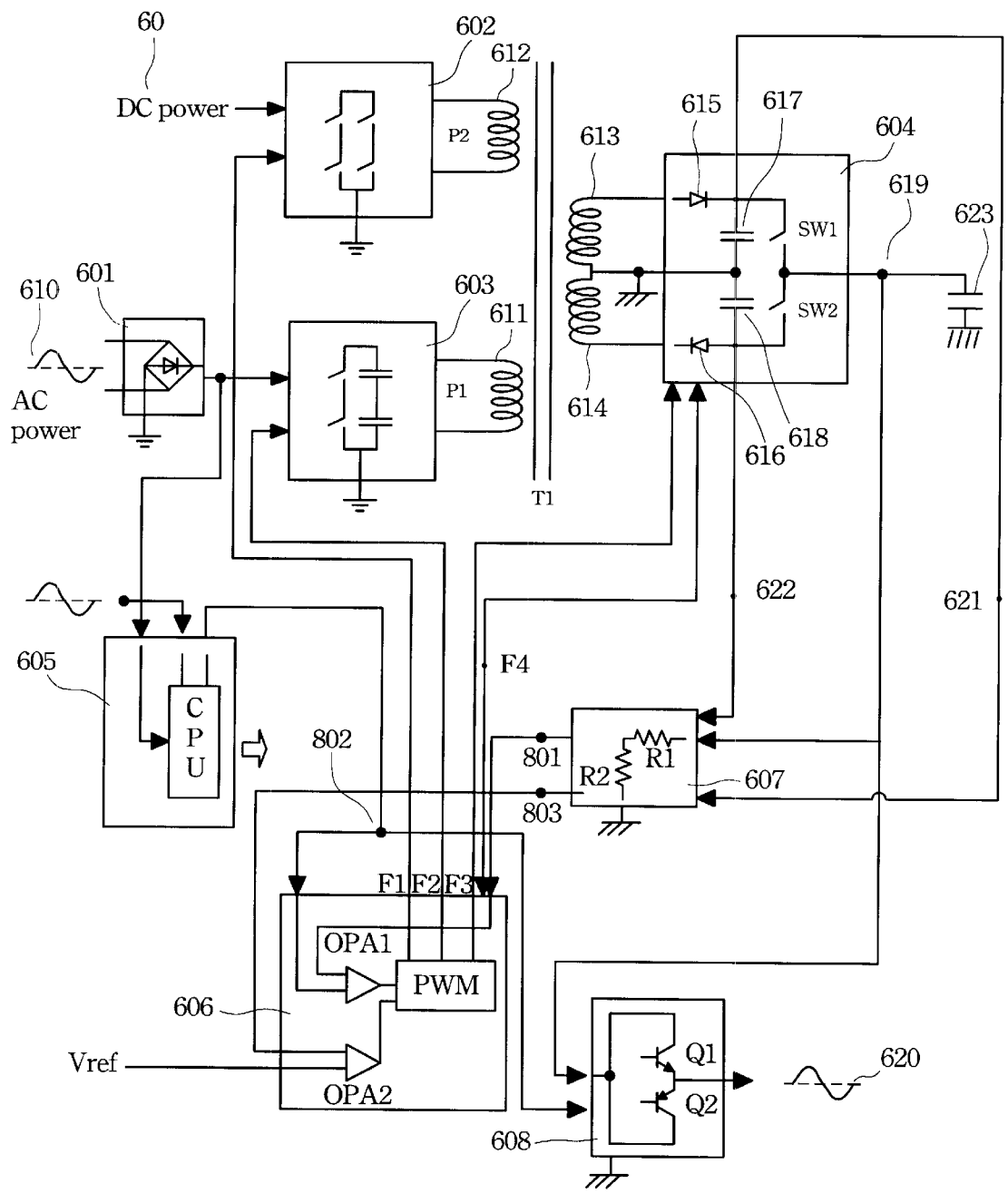
FIG. 6 is a detail diagram of a high efficiency amplifier system in accordance with the present invention.

FIG. 6 is a detailed diagram of a high efficiency amplifier system in accordance with the present invention, which comprises a rectifier circuit 601, two switching circuits 602 and 603, a D.C.-to-A.C. circuit 604, a sine-wave producer and logic control circuit 605, a pulse-width-modulation and phase signal producer circuit 606, a feedback circuit 607 and an amplifier circuit 608. The power circuit 501 as shown in FIG. 5 is composed of the rectifier circuit 601, two switching circuits 602 and 603, and a D.C.-to-A.C. circuit 604 as shown in FIG. 6. The small signal producer 503 as shown in FIG. 5 is the sine-wave producer and logic control circuit 605 in FIG. 6. The pulse-width-modulation signal producer 504 as shown in FIG. 5 is the pulse-width-modulation and phase signal producer circuit 606 in FIG. 6. The feedback circuit 505 and the amplifier circuit 502 as shown in FIG. 5, respectively, are the feedback circuit 607 and the amplifier circuit 608 as shown in FIG. 6.

In accordance with the high efficiency amplifier system of the present invention, there are two switching circuits 602 and 603 in this system. The switching circuit 603 connects with the rectifier circuit 601. The switching circuit 602 connects with the DC power. The rectifier circuit 601 receives AC power 610 and outputs a DC power that is provided to the switching circuit 603 as the operation voltage $V_i$. On the other hand, the switching circuit 602 has the same function as the switching circuit 603. When the AC power 610 fails (as when utility power is interrupted), no operation voltage is provided to the switching circuit 603. At this time, the sine-wave producer and logic control circuit 605 generates an AC power failure signal to notify the switching circuit 603 to stop its work. On the other hand, the sine-wave producer and logic control circuit 605 generates a start signal to notify the switching circuit 602 to start its function. In this way, the switching circuit 602 replaces the switching circuit 603 to perform the rest of the work. The operation voltage provided to the switching circuit 602 comes from the DC power 60. At this time, the switching circuit 602 also receives a PWM signal generated by the pulse-width-modulation and phase signal producer circuit 606 and generates a corresponding PWM signal on the coil P2 of the transformer T1. Then, the PWM signal on the coil P2 is coupled to the coils 613 and 614 of the transformer T1. It should be noted that if the DC power is a battery set, the switching circuit 602 should contain a charge circuit.

The switching circuits 602 and 603 make use of conventional switching-circuit design. According to the magnitude of the required output power, the switching circuits 602 and 603 may be designed to be Flyback type, Forward type, Push-pull type, Half-bridge type or Full-bridge type. For example, referring to FIG. 7, the switching circuit of the amplifier system of the present invention uses the Full-bridge type design. The switching circuit is composed of two switch pairs. The first switch pair comprises semiconductor switches 701 and 702 and the second switch pair is composed of semiconductor switches 703 and 704. Therefore, the transmission of the energy is controlled by the two switch pairs. These switches may comprise BJTs, MOS transistors, GTOs or Diodes.

Figure 7:
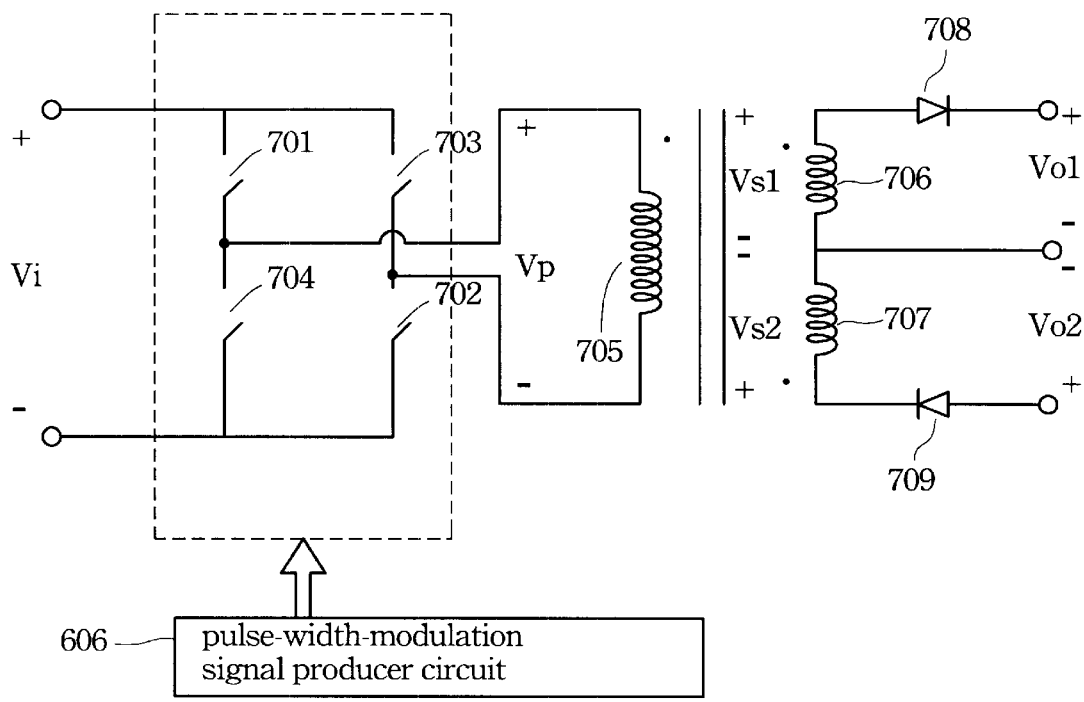
FIG. 7 is a schematic diagram of a full-bridge switching circuit in accordance with the present invention.

The PWM signal ($F_1$ or $F_2$) generated by the pulse-width-modulation and phase signal producer circuit 606 (as shown in FIG. 6) is used to control the two switch pairs. Referring to FIG. 7, the first switch pair composed of semiconductor switches 701 and 702 and the second switch pair composed of semiconductor switches 703 and 704 are alternatingly turned on and turned off in accordance with this PWM signal. When the semiconductor switches 701 and 702 are turned on, the voltage $V_p$ applied to the primary coil is equal to the input voltage $V_i$. Then, the voltage $V_p$ is coupled to the secondary coils 706 and 707. The diodes 708 and 709 are used to rectify the coupled voltage and $V_{o1}$ presents a positive voltage. On the other hand, $V_{o2}$ now presents a value of 0 volt. When the semiconductor switches 703 and 704 are turned on, the voltage $V_p$ applied to the primary coil is equal to the negative input voltage $(-V_i)$. Then, the voltage $V_p$ is coupled to the secondary coils 706 and 707. The diodes 708 and 709 are used to rectify the coupled voltage and $V_{o2}$ presents a negative voltage. $V_{o1}$ now presents a value of 0 volt. Therefore, the PWM signal generated by the pulse-width-modulation and phase signal producer circuit 606 may be used to control alternating turning on and off of the two switch pairs, (701,702) and (703,704). Then, $V_{o1}$ shows a modulated positive PWM signal, and $V_{o2}$ shows a modulated negative PWM signal. Obviously, in accordance with the above description, the PWM signal generated by the pulse-width-modulation and phase signal producer circuit 606 may be used to transform the input voltage $V_i$ into a positive PWM signal $V_{o1}$ and a negative PWM signal $V_{o2}$. Therefore, the frequency and the pulse wave width of $V_{o1}$ and $V_{o2}$ are equal to those of the PWM signal generated by circuit 606.

The PWM signals described in the above paragraphs are generated by the pulse-width-modulation and phase signal producer circuit 606. The main function of the pulse-width-modulation and phase signal producer circuit 606 is to generate the PWM signals, $F_1$ and $F_2$. The PWM signals, $F_1$ and $F_2$, are used as the control signals of the switching circuits 602 and 603. At the same time, the pulse-width-modulation and phase signal producer circuit 606 also generates a phase control signal $F_3$, which is a square wave, and a PWM signal $F_4$. These two signals, $F_3$ and $F_4$, are used as the control signal of the D.C.-to-A.C. circuit 604. There are two sets of operating amplifier circuits (OPA1 and OPA2) in the pulse-width-modulation and phase signal producer circuit 606. Each operating amplifier is used as a comparator. The sine wave 802 generated by the sine wave producer and logic control circuit 605 is used as a reference signal for the operating amplifier OPA1. It is noted that the reference signal, the sine wave 802, may be generated by the signal source outside the amplifier system of the present invention and may also be generated by an oscillator or a CPU in the amplifier system. In accordance with the preferred embodiment of the present invention, the sine wave 802 is generated by a CPU. The sine wave 802 not only supplies the operating amplifier OPA1 as the reference signal but also supplies the amplifier circuit 608 for amplification.

On the other hand, the sine wave 802 is sent to the operating amplifier OPA1 for comparison with a feedback signal 801 transmitted from the feedback circuit 607. The feedback signal 801 is a modulated signal that swings in a suitable voltage range for the operating amplifier OPA1. The DC signals 621 and 622 generated by the D.C.-to-A.C. circuit 604 are also sent to the feedback circuit 607 to generate another feedback signal 803. The feedback signal 803 is sent to the operating amplifier OPA2 for comparison with the reference signal $V_{ref}$.

In accordance with the present invention, the D.C.-to-A.C. circuit 604 outputs a quasi-sine wave signal. This quasi-sine wave signal may be sent to the operating amplifier OPA1 in the pulse-width-modulation and phase signal producer circuit 606 for comparison with the sine wave 802 generated by the sine-wave producer and logic control circuit 605 to generate a PWM signal $F_4$. The PWM signal $F_4$ adjusts the waveform of the quasi-sine wave signal after that of the sine wave 802. In accordance with the above description, the quasi-sine wave signal is first sent to the feedback circuit 607, and a modulated signal 801 with suitable voltage for the operating amplifier OPA1 is produced. Then, the modulated quasi-sine wave signal is compared with the sine wave 802 generated by the sine-wave producer and logic control circuit 605.

Figure 8:
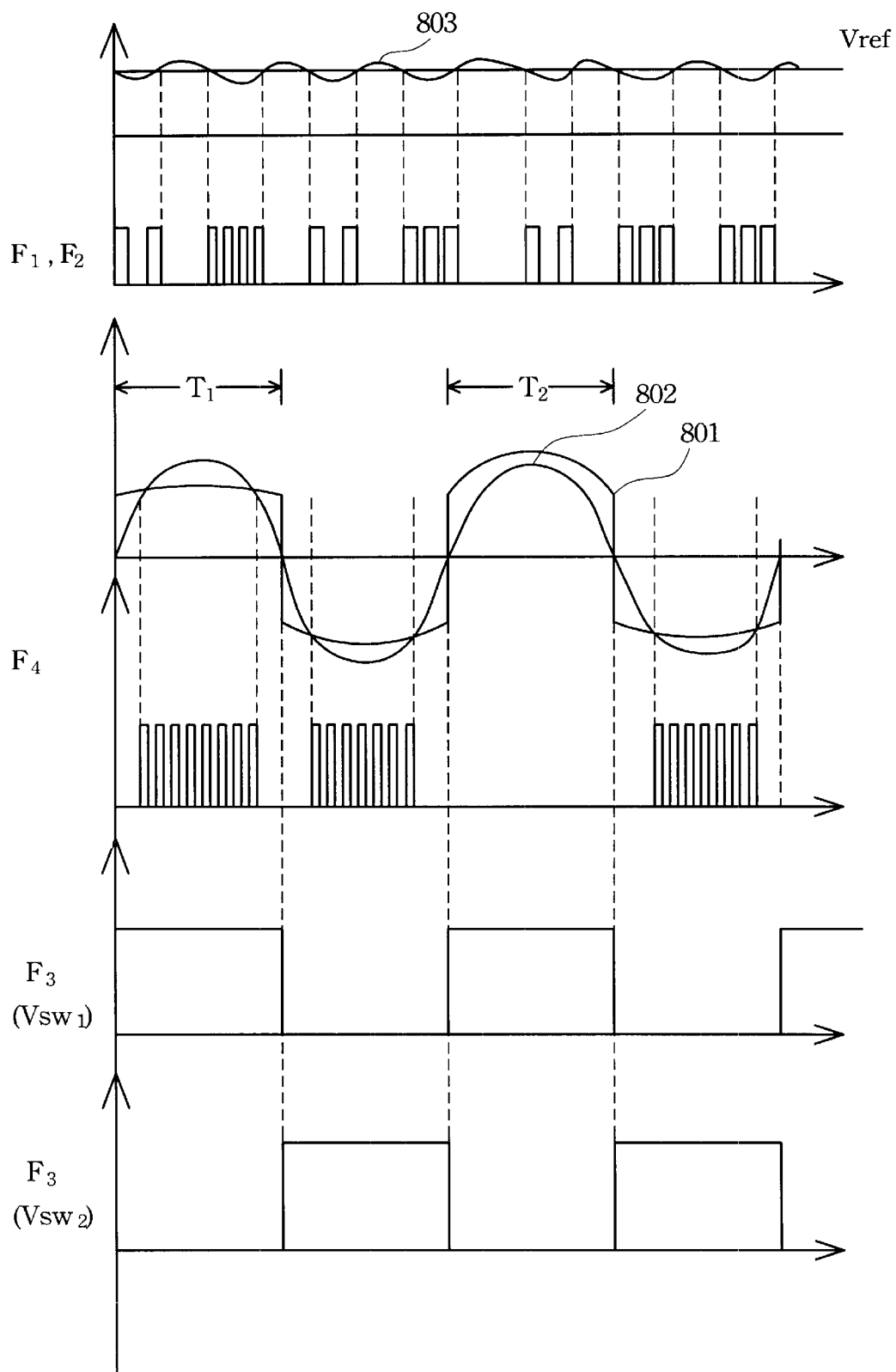
FIG. 8 is a waveform diagram of PWM wave and square wave arising from the comparison between the reference signal and the feedback signal.

FIG. 8 shows a waveform diagram of PWM wave and square wave arising from comparison of the reference signal and the feedback signal. The quasi-sine wave signal 619 (shown in FIG. 6) is first sent to the feedback circuit 607, and a modulated signal 801 with suitable voltage for the operating amplifier OPA1 is produced. The sine wave signal 802 is generated by the sine-wave producer and logic control circuit 605. In accordance with FIG. 8, if the feedback signal 801 is lower than the sine wave 802, as shown in period $T_1$, the pulse width of the PWM signal $F_4$ is enlarged to compensate for the voltage drop in the quasi-sine wave signal. In other words, compensation is made for the voltage drop of the output voltage generated by the D.C.-to-A.C. circuit 604. On the other hand, if the feedback signal 801 is greater than the sine wave 802, as shown in period $T_2$, the pulse width of the PWM signal $F_4$ is narrowed to drop the voltage of the quasi-sine wave signal, that is, to drop the output voltage generated by the D.C.-to-A.C. circuit 604. In accordance with FIG. 8, because the feedback signal 801 is greater than the sine wave 802 for all of period $T_2$, no PWM signal is provided in period $T_2$.

On the other hand, the coils 613 and 614 of the transformer T1 respectively output the positive PWM signal and the negative PWM signal. The diode 615 and capacitor 617 rectify the positive PWM signal and generate a stable positive D.C. voltage 621. The diode 616 and capacitor 618 also rectify the negative PWM signal and generate a stable negative D.C. voltage 622. Both the stable positive D.C. voltage 621 and the stable negative D.C. voltage 622 are then sent to the feedback circuit 607 to generate a feedback signal 803 with suitable voltage for the operating amplifier OPA2 in the pulse-width-modulation and phase signal producer circuit 606. This feedback signal 803 is sent to the operating amplifier OPA2 in the pulse-width-modulation and phase signal producer circuit 606. Then, this feedback signal 803 is compared with the reference signal Vref. If the voltage of the feedback signal 803 is lower than the voltage of the reference signal Vref, the pulse-width-modulation and phase signal producer circuit 606 generates the PWM signals, F1, and F2. These two PWM signals are used to compensate for the voltage drop in the stable positive D.C. voltage 621 and the stable negative D.C. voltage 622 to required voltage levels. On the other hand, if the voltage of the feedback signal 803 is greater than the voltage of the reference signal Vref, the pulse-width-modulation and phase signal producer circuit 606 does not generate any PWM signals. In this situation, the stable positive D.C. voltage 621 and the stable negative D.C. voltage 622 are dropped to the required voltage levels. At the same time, the pulse-width-modulation and phase signal producer circuit 606 also generates a phase-control square wave signal F3 and a PWM signal F4. These two signals, F3 and F4 are used to control the switching state of the semiconductor switches SW1 and SW2. The stable positive D.C. voltage 621 and the stable negative D.C. voltage 622 charge the capacitor 623 alternatively and generate a quasi-sine wave, 619.

In accordance with the above description, the tuning process of the quasi-sine wave is performed continually by comparison of the feedback signal 801 with the sine wave 802 in the pulse-width-modulation and phase signal producer circuit 606. Because the compared (or reference) signal is the sine wave 802, the tuning process makes the output signal become a quasi-sine wave but with noise and distortion. The stable positive D.C. voltage 621 and the stable negative D.C. voltage 622 in the D.C.-to-A.C. circuit 604 are sent to the feedback circuit 607 to generate a feedback signal 803 with suitable voltage for the operating amplifier OPA2 in the pulse-width-modulation and phase signal producer circuit 606. This feedback signal 803 is sent to the operating amplifier OPA2 in the pulse-width-modulation and phase signal producer circuit 606. Then, this feedback signal 803 is compared with the reference signal $V_{ref}$ and generates the PWM signals, $F_1$ and $F_2$. The PWM signals, $F_1$ and $F_2$, are used as the control signal of the switching circuits 602 and 603. The output voltage generated by the switching circuits 602 or 603 in accordance with the PWM signal, $F_1$ or $F_2$, is sent to the transformer T1 and coupled signals, which are modulated signals of the PWM signal F1 or F2, are produced on the coils 613 and 614. Because the modulated PWM voltages are generated by comparison of feedback signal 803 with the reference voltage $V_{ref}$, the D.C.-to-A.C. circuit 604 generates a stable positive D.C. voltage 621 and a stable negative D.C. voltage 622. In other words, the main function of the feedback signal 803 is to keep the positive D.C. voltage 621 and the negative D.C. voltage 622 at stable levels.

Still referring to FIG. 8, on the other hand, the sine wave 802 is sent to the operating amplifier OPA1 for comparison with a feedback signal 801 transmitted from the feedback circuit 607 to generate a phase control square wave signal $F_3$ and a PWM signal $F_4$. These two signals, $F_3$ and $F_4$, are used to control the switching state of the semiconductor switches $SW_1$ and $SW_2$ in the D.C.-to-A.C. circuit 604. The square wave signal $F_3$ ($V_{SW1}$) related to the positive part of the sine wave 802 and the PWM signal $F_4$ are used to control the switching state of the semiconductor switch $SW_1$. When the square wave signal $F_3$ ($V_{SW1}$) is at a high voltage level, the switching state of the semiconductor switch $SW_1$ is controlled by the PWM signal $F_4$. On the other hand, the square wave signal $F_3$ ($V_{SW2}$) related to the negative part of the sine wave 802 and the PWM signal $F_4$ are used to control the switching state of the semiconductor switch $SW_2$. When the square wave signal $F_3$ ($V_{SW2}$) is at a high voltage level, the switching state of the semiconductor switch $SW_2$ is controlled by the PWM signal F4.

Figure 9:
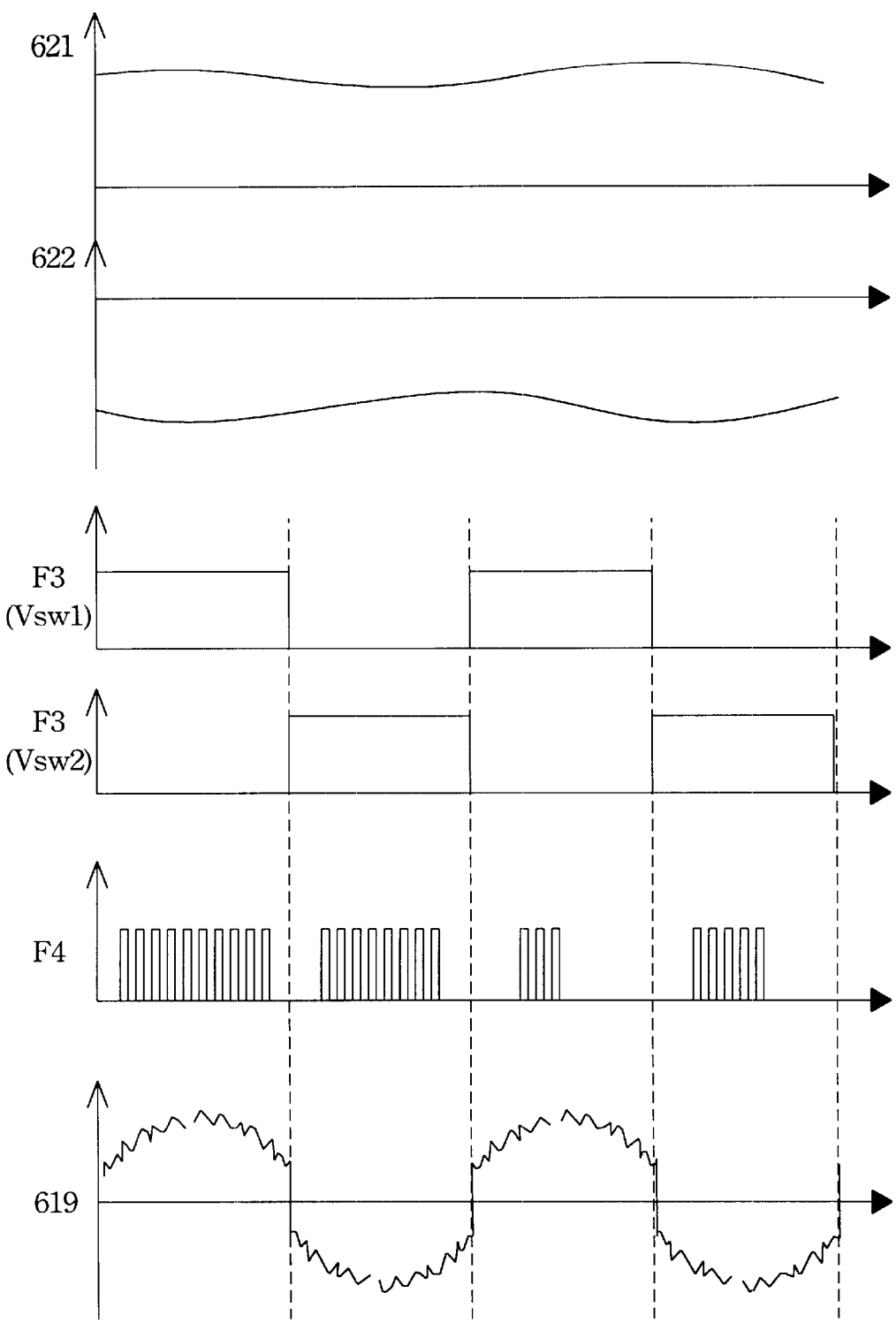
FIG. 9 is a waveform diagram further illustrating the operation of DC-to-AC circuit.

The D.C.-to-A.C. circuit 604 is used to receive a DC signal and generate an AC signal. Therefore, the D.C.-to-A.C. circuit 604 receives the DC signals that are PWM signals transmitted from the coils 613 and 614 of the transformer T1 and have the same frequency and the same pulse width as the PWM signals, $F_1$ and $F_2$, and generates a quasi-sine wave signal with the same phase as the sine wave 802 generated by the sine-wave producer and logic control circuit 605. The D.C.-to-A.C. circuit 604 comprises two diodes 615 and 616 and two capacitors 617 and 618. This circuit may receive the PWM signals transmitted form the coils 613 and 614 of the transformer T1 to generate the stable positive D.C. voltage 621 and the stable negative D.C. voltage 622. FIG. 9 is a waveform diagram further illustrating the operation of the D.C.-to-A.C. circuit. The diode 615 is only capable of conducting positive voltage. The diode 616 is only capable of conducting negative voltage. The positive voltage transmitted from diode 615 and the negative voltage transmitted from diode 616 charge the capacitors 617 and 618, respectively, to output the stable positive D.C. voltage 621 and the stable negative D.C. voltage 622, in which the two output voltages have a little ripple.

Referring to FIG. 9 again, the phase control square wave signal $F_3$ and the PWM signal $F_4$ generated by the pulse-width-modulation and phase signal producer circuit 606 are used to control the switching state of the semiconductor switches $SW_1$ and $SW_2$ in the D.C.-to-A.C. circuit 604. The square wave signal $F_3$ ($V_{SW1}$) related to the positive part of the sine wave 802 in the FIG. 8 and the PWM signal $F_4$ are used to control the switching state of the semiconductor switch $SW_1$. The square wave signal $F_3$ ($V_{SW2}$) related to the negative part of the sine wave 802 in FIG. 8 and the PWM signal $F_4$ are used to control the switching state of the semiconductor switch $SW_2$. The square wave signal $F_3$ ($V_{SW1}$), $F_3$ ($V_{SW2}$) and the PWM signal $F_4$ precisely control the switching state of the semiconductor switches $SW_2$ and $SW_1$. For example, when the square wave signal $F_3$ ($V_{SW1}$) is at a high voltage level, the switching state of the semiconductor switch $SW_1$ is controlled by the PWM signal F4. Thus, if a pulse of the PWM signal F4 appears now, the semiconductor switch SW1 turns on and the positive D.C. voltage 621 is outputted to charge the capacitor 623. Similarly, when the square wave signal $F_3$ ($V_{SW2}$) is at a high voltage level, the switching state of the semiconductor switch $SW_2$ is controlled by the PWM signal F4. Thus, if a pulse of the PWM signal F4 appears now, the semiconductor switch SW2 turns on and the negative D.C. voltage 622 is output to charge the capacitor 623. On the other hand, the tuning process of the quasi-sine wave signal 619 is performed continually by comparison of the feedback signal 801 with the sine wave 802 in the pulse-width-modulation and phase signal producer circuit 606. Because the compared (or reference) signal is the sine wave 802, the tuning process makes the output signal become a quasi-sine wave, 619, but with a little noise and distortion. The waveform of the quasi-sine wave 619 is formed by charging the capacitor 623 with the positive D.C. voltage 621 and the negative D.C. voltage 622, alternatingly.

The stable positive D.C. voltage 621 and the stable negative D.C. voltage 622, respectively, charge the capacitor 623 through the semiconductor switches SW1 and SW2 and generate an output voltage. The outputted voltage has a little noise and distortion when compared with the sine wave. Therefore, the output voltage is called a quasi-sine wave. Although it is not suitable to take the quasi-sine wave 619 as the output of the amplifier system, using the quasi-sine wave 619 as the supply voltage source of the amplifier circuit 608 improves the output efficiency of the amplifier system.

The amplifier circuit 608 can be designed to be a Class A, Class B, Class AB or other type of amplifier circuit. The quasi-sine wave 619 generated by the D.C.-to-A.C. circuit 604 is sent to the amplifier circuit 608 as the supply voltage source. That is, the waveform of the supply voltage source, i.e. the quasi-sine wave 619, provided to the amplifier circuit 608 has the same phase as that of the sine wave 802. Then, the sine wave 802 provided by the sine-wave producer and logic control circuit 605 is amplified to be a large sine-wave signal 620 with the same phase as the sine wave 802. Because the large sine-wave signal 620 and the quasi-sine wave 619 provided by the D.C.-to-A.C. circuit 604 both have the same phase as the sine wave 802, the large sine-wave signal 620 also has the same phase as the quasi-sine wave 619 provided by the D.C.-to-A.C. circuit 604. The tuning process of the quasi-sine wave is performed continually by comparison of the feedback signal 801 with the sine wave 802 in the pulse-width-modulation and phase signal producer circuit 606. Because the compared (or reference) signal is a sine wave 802, the tuning process makes the output signal of the D.C.-to-A.C. circuit 604 become a quasi-sine wave, 619, but with a little noise and distortion. On the other hand, the large sine-wave signal 620 is generated by amplifying the sine wave 802. Therefore, the quasi-sine wave 619 provided by the D.C.-to-A.C. circuit 604 and the large sine-wave signal 620 have similar waveforms and amplitudes. The voltage difference between them is quite small. In other words, the waveform of the quasi-sine wave 619 provided by the D.C.-to-A.C. circuit 604 changes with the waveform of the sine wave 620. When the peak value of the large sine wave signal 620 is output, the voltage value of the quasi-sine wave 619 provided by the D.C.-to-A.C. circuit 604 is at a maximum. On the other hand, in accordance with the present invention, the supply voltage source provided to the amplifier circuit 608 is applied to both the two ends which are powered by a positive D.C. voltage source and a negative D.C. voltage source, respectively, in accordance with the traditional amplifier system. Applying the single dynamic voltage source, 619, in the amplifier system of the present invention reduces the power loss of the switch devices. The required rating voltage of the switch devices in the amplifier circuit 608 is significantly lowered. Therefore, the design of the present invention not only raises the reliability of the circuit but also makes finding suitable semiconductor switches easier. The cost of the present invention is decreased and the size of the heat sink required is greatly reduced.

Figure 10:
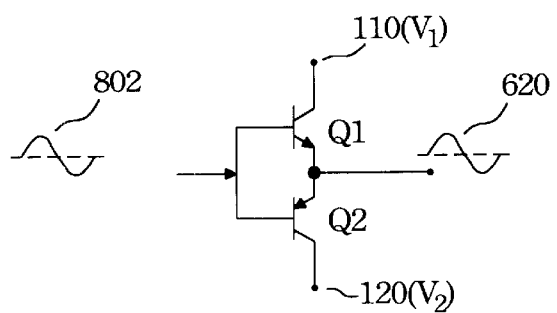
FIG. 10A is an enlarged schematic diagram of a Class B amplifier circuit in accordance with the present invention.
FIG. 10B is a waveform diagram further illustrating the operation of the Class B amplifier circuit shown in FIG. 10A.
Figure 10:
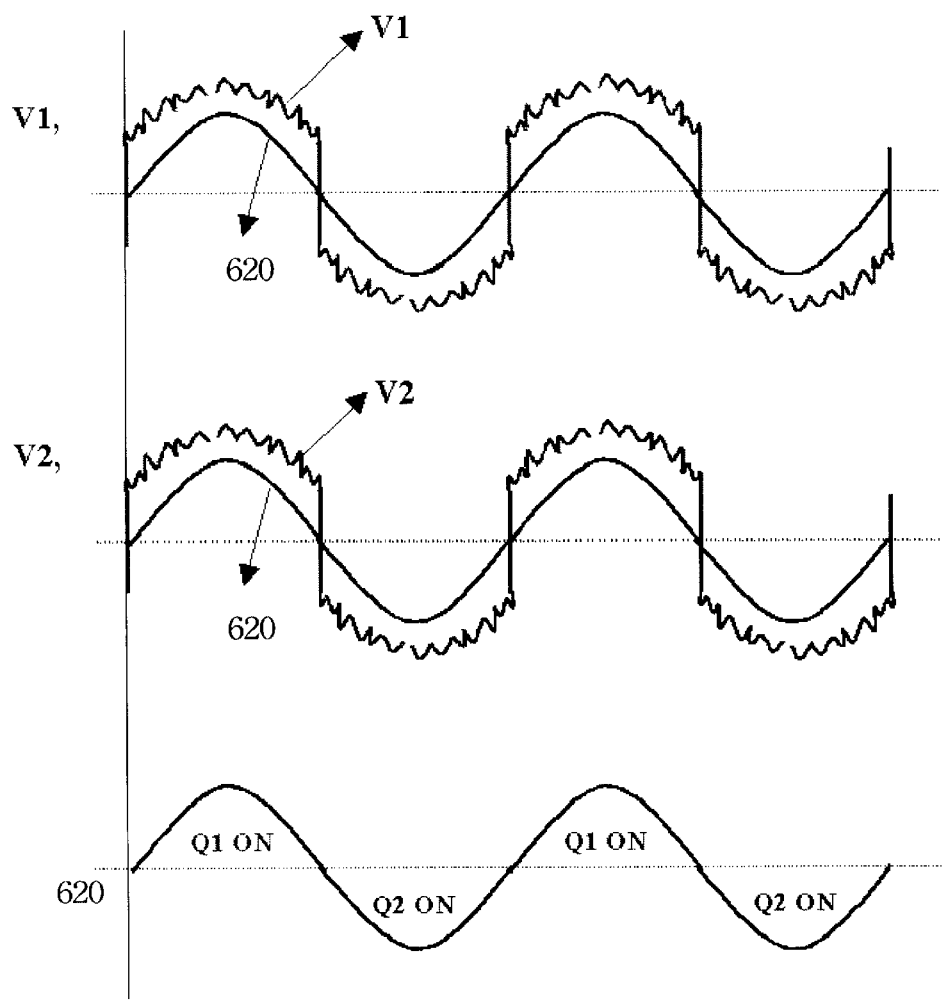

FIG. 10A is an enlarged schematic diagram of a Class B amplifier circuit in accordance with the present invention. Other amplifier circuits, such as Class A, Class AB or other type amplifier circuits, can be analyzed by the same method as described in the following analysis. First, amplifier circuit 608 is powered by the quasi-sine wave 619 generated by the D.C.-to-A.C. circuit 604. The sine wave 802 is supplied to the amplifier circuit 608 to generate the amplified sine wave signal 620.

FIG. 10B is a waveform diagram further illustrating the operation of the Class B amplifier circuit in FIG. 10A. The quasi-sine wave 619 generated by the D.C.-to-A.C. circuit 604 is supplied to the node 110 of the amplifier circuit 608 as the operation voltage $V_1$. At the same time, the quasi-sine wave 619 is also supplied to the node 120 of the amplifier circuit 608 as the operation voltage $V_2$. The transistor $Q_1$ is responsible for amplifying the positive part of the sine wave 802, and the transistor $Q_2$ is responsible for amplifying the negative part of the sine wave 802. The transistors $Q_1$ and $Q_2$ operate in a linear region. The waveform of the operation voltage $V_1$ and the operation voltage $V_2$, i.e. the quasi-sine wave 619, undulate after the waveform of the amplified sine wave signal 620.

In accordance with the above description, the power loss and the rating voltage required of the transistors Q1 and Q2 are shown as follows. When the transistor $Q_1$ turns on, the voltage difference ($V_{ce}$) between the collector electrode and the emitter electrode of the transistor $Q_1$ is described as follows:

$$V_{CE}(Q_1)=V_1-V_{out}=\Delta V\equiv 0$$

$V_1$ is the operation voltage supplied to the node 110 of the amplifier circuit 608. $V_{out}$ is the voltage of the amplified sine wave signal 620. In accordance with the above equation, $\Delta V$ can be reduced to almost zero if this circuit is carefully designed. In particular, in an ideal situation, the voltage value of $\Delta V$ is zero. That is, the power loss of the transistors $Q_1$ is almost zero. At this time, the voltage difference between the collector electrode and the emitter electrode of the transistor $Q_2$ is described as follows:

$$V_{CE}(Q_2)=V_2-V_{out}=\Delta V\equiv 0$$

$V_2$ is the operation voltage supplied to the node 120 of the amplifier circuit 608. $V_{out}$ is the voltage of the amplified sine wave signal 620. In accordance with the above equation, $\Delta V$ can be reduced to almost zero if this circuit is carefully designed. In an ideal situation, the voltage value of $\Delta V$ is zero. That is, the required rating voltage of the transistor $Q_2$ is almost zero. Therefore, the circuit design of the present invention is not similar to the conventional circuit design that requires transistors with large rating voltages.

When the transistor $Q_2$ turns on, the voltage difference ($V_{ce}$) between the collector electrode and the emitter electrode of the transistor $Q_2$ is described as follows:

$$V_{CE}(Q_2)=V_2-V_{out}=\Delta V\equiv 0$$

$V_2$ is the operation voltage supplied to the node 120 of the amplifier circuit 608. $V_{out}$ is the voltage of the amplified sine wave signal 620. In accordance with the above equation, the $\Delta V$ can be reduced to almost zero if this circuit is carefully designed. In an ideal situation, the voltage value of $\Delta V$ is zero. That is, power loss of the transistor $Q_2$ is almost zero. At this time, the voltage difference between the collector electrode and the emitter electrode of the transistor $Q_1$ is described as follows:

$$V_{CE}(Q_1)=V_1-V_{out}=\Delta V\equiv 0$$

$V_1$ is the operation voltage supplied to the node 110 of the amplifier circuit 608. $V_{out}$ is the voltage of the amplified sine wave signal 620. In accordance with the above equation, $\Delta V$ can be reduced to almost zero if this circuit is carefully designed. In an ideal situation, the voltage value of $\Delta V$ is zero. That is, the required rating voltage of the transistor $Q_1$ is almost zero. Therefore, from the above description, the output efficiency of the amplifier system in accordance with the present invention may reach the maximum value.

The sine wave 802 generated by the sine-wave producer and logic control circuit 605 can also be produced by the signal producer outside the amplifier system of the present invention and may also be generated by an oscillator or a CPU of the amplifier system. In accordance with the preferred embodiment of the present invention, the sine wave 802 is produced by the CPU. It is noted that any type of signal can be amplified by this amplifier system. The working principle of the amplifier system is same as the above description. However, if the waveform of the signal 802 is changed, the waveforms of the signal 619, voltages $V_1$ and $V_2$, feedback signal 801 and the amplified signal 620 change according to the waveform of the signal 802.

As is understood by a person skilled in the art, the foregoing preferred embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structure.

What is claimed is:

1. A high efficiency amplifier system comprising:
   a signal producer for generating a synchronized sine-wave reference signal and input signal;
   a pulse-width-modulation (PWM) signal producer for receiving a D.C. reference potential and generating a first PWM signal according to the D.C. reference potential, and generating a second PWM signal and a logic control signal according to the sine-wave reference signal;

a power circuit for receiving an input power and modulating the input power to a pair of a stable D.C. powers according to the first PWM signal, and modulating the pair of the stable D.C. power to a quasi-sine wave power with a same phase as the sine-wave reference signal according to the second PWM signal and the logic control signal generated;

a feedback circuit for receiving the quasi-sine wave power and generating a first feedback signal, wherein the first feedback signal is sent to said PWM signal producer for comparison with the sine-wave reference signal to generate the second PWM signal, the second PWM signal is sent to said power circuit to tune the quasi-sine wave power, said feedback circuit also receives the pair of the stable D.C. powers and generates a second feedback signal, and the second feedback signal is sent to said PWM signal producer for comparison with the D.C. reference potential for generating the first PWM signal to send to said power circuit to tune the pair of the stable D.C. powers; and an amplifier circuit for receiving the quasi-sine wave power as the supply power and amplifying the input signal.

2. The high efficiency amplifier system according to claim 1, wherein said amplifier circuit is a Class A, Class B or Class AB amplifier circuit.

3. The high efficiency amplifier system according to claim 1, wherein said quasi-sine wave power and the sine-wave reference signal have identical phases.

4. The high efficiency amplifier system according to claim 1, wherein said power circuit receives the first and second PWM signals and the logic control signal to transform the input power into the quasi-sine wave power, comprising:

a rectifier circuit for receiving the input power and transforming the input power to a D.C. power;

a first switching circuit for receiving the D.C. power and transforming the D.C. power into a third PWM signal according to the first PWM signal;

a transformer for adjusting the third PWM signal to a required amplitude; and a D.C.-to-A.C. circuit for receiving an adjusted third PWM signal and transforming the adjusted third PWM signal into a pair of stable D.C. powers, and transforming the pair of the stable D.C. powers into the quasi-sine wave power with the same phase as the sine-wave reference signal according to the second PWM signal and the logic control signal.

5. The high efficiency amplifier system according to claim 1, further comprising:

a backup D.C. power for supplying the D.C. power when the input power fails; and a second switching circuit for receiving the backup D.C. power and transforming said backup D.C. power into a fourth PWM signal according to the first PWM signal.

6. The high efficiency amplifier system according to claim 5, wherein said second switching circuit starts to work when the input power fails.

7. The high efficiency amplifier system according to claim 5, wherein when the input power fails, said backup D.C. power starts working, and said second switching circuit transforms said backup D.C. power into the fourth PWM signal according to the first PWM signal, whereupon the fourth PWM signal is sent to said transformer for adjusting the fourth PWM signal to the required amplitude, the adjusted fourth PWM signal is sent to said D.C.-to-A.C. circuit for transforming into a pair of stable D.C. powers, and the pair of stable D.C. powers is modulated to the quasi-sine wave power with the same phase as the sine-wave reference signal according to the second PWM signal and the logic control signal.

8. The high efficiency amplifier system according to claim 4, wherein said D.C.-to-A.C. circuit comprises:

a first diode for conducting a positive part of the adjusted third or fourth PWM signal to generate a stable D.C. positive power;

a second diode for conducting a negative part of the adjusted third or fourth PWM signal to generate a stable D.C. negative power;

a first switch device coupling with said first diode and conducting a positive half-wave voltage signal according to the second PWM signal and the logic control signal; and a second switch device coupling with said second diode and conducting a negative half-wave voltage signal according to the second PWM signal and the logic control signal, wherein a phase difference between the positive half-wave signal and the negative half-wave signal is 180 degrees, and a quasi-sine wave is thus generated at a common node of said first switch device and said second switch device.

9. The high efficiency amplifier system according to claim 8, wherein said first diode further couples with a capacitor.

10. The high efficiency amplifier system according to claim 8, wherein said second diode further couples with a capacitor.

11. The high efficiency amplifier system according to claim 8, wherein the common node of said first and said second switch devices further couples with a capacitor.

12. The high efficiency amplifier system according to claim 4, wherein said first and second switching circuits are designed as Flyback-type, Forward-type, Push-pull-type, Half-bridge-type or Full-bridge-type.

13. A power system capable of generating a quasi-sine wave power, comprising:

a signal producer for generating a synchronized sine-wave reference signal and input signal;

a pulse-width-modulation (PWM) signal producer for receiving a D.C. reference potential and generating a first PWM signal according to the D.C. reference potential, and generating a second PWM signal and a logic control signal according to the sine-wave reference signal; and a power circuit for receiving the first and second PWM signals and the logical control signal and transforming the input power into the quasi-sine wave power, wherein said power circuit comprises:

a rectifier circuit for receiving the input power and transforming the input power into a D.C. power;

a first switching circuit for receiving the D.C. power and transforming the D.C. power to the third PWM signal according to the first PWM signal;

a transformer for adjusting the third PWM signal to a required amplitude; and a D.C.-to-A.C. circuit for receiving the adjusted third PWM signal and transforming an adjusted third PWM signal to a pair of stable D.C. powers, and modulating the pair of the stable D.C. powers to a quasi-sine wave power with a phase identical to that of the sine-wave reference signal according to the second PWM signal and the logic control signal; and a feedback circuit for receiving the quasi-sine wave power and generating a first feedback signal, wherein the first feedback signal is sent to said PWM signal producer for comparison with the sine-wave reference signal to generate the second PWM signal, the second PWM signal is sent to said power circuit to tune the quasi-sine wave power, said feedback circuit receives the pair of the stable D.C. powers and generates a second feedback signal, and the second feedback signal is sent to said PWM signal producer for comparison with the D.C. reference potential and generation of the first PWM signal to send to said power circuit to tune the pair of the stable D.C. powers.

14. The power system according to claim 13, further comprising:

a backup D.C. power for supplying the D.C. power when the input power fails; and a second switching circuit for receiving the backup D.C. power and transforming said backup D.C. power into a fourth PWM signal according to the first PWM signal.

15. The power system according to claim 14, wherein said second switching circuit starts to work when the input power fails.

16. The power system according to claim 14, wherein when the input power fails, said backup D.C. power starts working, and said second switching circuit transforms said backup D.C. power into a fourth PWM signal according to the first PWM signal, the fourth PWM signal is sent to said transformer for adjusting the fourth PWM signal to a required amplitude, the adjusted fourth PWM signal is sent to said D.C.-to-A.C. circuit for transforming the adjusted fourth PWM signal into a pair of stable D.C. powers, and the pair of stable D.C. powers is modulated to the quasi-sine wave power with the same phase as the sine-wave reference signal according to the second PWM signal and the logic control signal.

17. The power system according to claim 13, wherein said quasi-sine wave power and the sine-wave reference signal have identical phases.

18. The power system according to claim 13, wherein said D.C.-to-A.C. circuit comprises:

a first diode for conducting the positive part of the adjusted third or fourth PWM signal to generate a stable D.C. positive power;

a second diode for conducting the negative part of the adjusted third or fourth PWM signal to generate a stable D.C. negative power;

a first switch device coupling with said first diode and conducting the positive half-wave voltage signal according to the second PWM signal and the logic control signal; and a second switch device coupling with said second diode and conducting the negative half-wave voltage signal according to the second PWM signal and the logic control signal, wherein a phase difference between the positive half-wave signal and the negative half-wave signal is 180 degrees, and a quasi-sine wave is thus generated at the common node of said first switch device and said second switch device.

19. The power system according to claim 18, wherein said first diode further couples with a capacitor.

20. The power system according to claim 18, wherein said second diode further couples with a capacitor.

21. The power system according to claim 18, wherein the common node of said first and said second switch devices further couples with a capacitor.

22. The power system according to claim 13, wherein said first and second switching circuits are designed as Flyback-type, Forward-type, Push-pull-type, Half-bridge-type or Full-bridge-type.

23. A method for generating a high efficiency amplified output, comprising:

using a signal producer to generate a synchronized sine-wave reference signal and input signal;

generating a first pulse-width-modulation (PWM) signal and a logic control signal according to the sine-wave reference signal;

generating a second PWM signal according to a D.C. reference potential;

transforming the input power into a pair of stable D.C. powers according to said second PWM signal;

modulating the pair of the stable D.C. powers to a quasi-sine wave power with a same phase as the sine-wave reference signal according to the first PWM signal and the logic control signal;

providing said quasi-sine wave power to power an amplifier circuit to amplify the input signal; and using a feedback circuit for tuning said pair of the stable D.C. powers and said quasi-sine wave power.

24. The method according to claim 23, wherein using the feedback circuit for tuning said pair of the stable D.C. powers and said quasi-sine wave power comprises:

transmitting said pair of stable D.C. powers and said quasi-sine wave power to compare respectively with said D.C. reference potential and said sine-wave reference signal to generate first and second PWM signals; and using said first and second PWM signals to tune said quasi-sine wave power and said pair of stable D.C. powers.

25. The method according to claim 23, wherein said amplifier circuit is a Class A, Class B or Class AB amplifier circuit.

26. The method according to claim 23, wherein said quasi-sine wave power has the same phase as the sine-wave reference signal.

27. The method according to claim 23, wherein transforming the input power into the pair of stable D.C. powers according to said second PWM signal further comprises:

receiving the input power and rectifying the input power to a D.C. power;

transforming said D.C. power into the third PWM signal according to the second PWM signal; and transforming said third PWM signal into the pair of stable D.C. powers.

28. The method according to claim 23, wherein modulating the pair of stable D.C. powers to the quasi-sine wave power with the same phase as the sine-wave reference signal according to the first PWM signal and the logic control signal further comprises:

conducting said stable D.C. positive power and generating a positive voltage;

conducting said stable D.C. negative power and generating a negative voltage; and alternatingly outputting said positive voltage and said negative voltage to said amplifier circuit according to the first PWM signal and the logic control signal.

29. The method according to claim 27, wherein transforming said D.C. power into the third PWM signal according to the second PWM signal is realized by a Flyback-type design, Forward-type design, Push-pull-type design, Half-bridge-type design or Full-bridge-type design.

* * * * *